(12) United States Patent
Babcock et al.

(10) Patent No.: US 6,407,425 B1
(45) Date of Patent: Jun. 18, 2002

(54) PROGRAMMABLE NEURON MOSFET ON SOI

(75) Inventors: Jeffrey A. Babcock, Neufahrn; Scott G. Balster, Munich, both of (DE); Gregory E. Howard, Dallas, TX (US); Angelo Pinto, Buch Am Erlbach; Philipp Steinmann, Munich, both of (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/952,451

(22) Filed: Sep. 14, 2001

Related U.S. Application Data

(60) Provisional application No. 60/234,397, filed on Sep. 21, 2000.

(51) Int. Cl.[7] .................. H01L 29/788; H01L 29/76; H01L 27/01; H01L 27/12; H01L 31/0392
(52) U.S. Cl. .................. 257/318; 257/315; 257/319; 257/350; 257/351
(58) Field of Search .................. 257/315, 318, 257/319, 350, 351

(56) References Cited

U.S. PATENT DOCUMENTS

| | | | | |
|---|---|---|---|---|
| 5,258,657 A | * | 11/1993 | Shibata et al. | 307/201 |
| 5,633,520 A | * | 5/1997 | Wu et al. | 257/315 |
| 5,806,054 A | * | 9/1998 | Bergemont et al. | 706/33 |
| 5,895,945 A | * | 4/1999 | Pan et al. | 257/300 |

* cited by examiner

*Primary Examiner*—Ngân V. Ngô
(74) *Attorney, Agent, or Firm*—Peter K. McLarty; W. James Brady, III; Frederick J. Telecky, Jr.

(57) ABSTRACT

The instant invention describes a programmable neuron MOSFET structure formed on SOI substrates. A number of input capacitor structures (241, 231) are formed on a SOI substrate. The substrate region of the capacitors (330, 340) are completely isolated from each other by isolation structures (270). In addition the transistor structure (210) of the neuron MOSFET is completely isolated from the capacitor structures (241, 231) by the isolation structure (270). The neuron MOSFET also comprises a contiguous floating conductive layer (200, 230, and 240) which forms the gate structure of the capacitors (230, 240) and the floating gate (200) of the transistor structure.

24 Claims, 5 Drawing Sheets

PROGRAMMABLE NEURON MOSFET ON SOI

This application claims priority under 35 USC § 119(e)(1) of provisional application Ser. No. 60/234,397, filed Sep. 21, 2000.

FIELD OF THE INVENTION

The present invention relates to a single polysilicon neuron MOSFET on SOI. The described single polysilicon neuron MOSFET has synaptic learning capability without the cross-talk noise and leakage current associated with conventional neuron MOSFETs.

BACKGROUND OF THE INVENTION

Technologies capable of implementing intelligence on an integrated circuit hardware level is rapidly emerging as a key enabling step for the development of the next generation low-power self-sufficient portable systems and products. These technologies, which contain devices known as evolvable hardware, have been the focus of new efforts to develop autonomous, adaptive and fault tolerant electronic systems with the capability to learn and self-adjust depending on the environment and algorithm used for the new product applications. One of the most promising technologies for achieving these goals is known as the neuron MOSFET. FIG. 1 shows a circuit schematic of a neuron MOSFET with n capacitively coupled inputs 115-1, 115-2, . . . and 115-n, to the floating gate 100. The source 110 and the drain 105 of the transistor are also represented in FIG. 1. Each capacitively coupled input has a capacitance associated with it given by $C_1, C_2, \ldots,$ and $C_n$ for the inputs 115-1, 115-2, . . . , and 115-n respectively. Defining a total capacitance $C_{TOT}$ as $$C_{TOT} = \sum_{i=0}^{n} C_i \qquad (1.1)$$

a Factor Z can be determined as $$Z = \sum_{i=0}^{n} W_i V_i > V_{TH} - (C_o / C_{TOT}) V_o - Q_F / C_{TOT} \qquad (1.2)$$

where $$W_i = C_i / C_{TOT}$$

Equation 1.1 means that the value of the linear sum of all input voltages to the gates 115-1, 115-2, . . . , and 115-n weighted by $W_1, W_2, \ldots,$ and $W_n$ becomes larger than $V_{TH}^*$ given by Eq. (1.3), the device turns on and the source 110 and drain 105 are connected. See U.S. Pat. No. 5,258,657 of Shibata et al.

$$V_{TH}^* = V_{TH} - (C_o / C_{TOT}) V_o - Q_F / C_{TOT} \qquad (1.3)$$

where $C_o$ is the capacitance between the floating gate and the substrate and $Q_F$ is the charge on the floating gate. Because the neuron MOSFET sums the input voltages and the output condition is dependent on this sum being greater than the threshold voltage of the MOSFET, the device behaves similar to a biological neuron. The neuron MOSFET offers advantages for both digital and analog applications since the input signals can be isolated from the biasing networks. This allows for significant advantages when designing analog circuits for low power applications.

Prior Art on forming neuron MOSFETs has focused on bulk silicon using the following two basic approaches. The dual polysilicon process typically found in technologies developed for EEPROM applications is described in the U.S. Pat. No. 5,258,657 of Shibata et al. and the single-gate polysilicon process described in the U.S. Pat. No. 5,895,945 of Pan et al. Although both of these approaches are successful in making neuron MOSFETs, they have some severe limitations regarding manufacturability of the devices. especially for analog applications. Some of the limitations of these two approaches will now be discussed. In the case of the dual-polysilicon process, there is difficulty in achieving matching in the neuron MOSFETs and uniformity in device characteristics from die to die, wafer to wafer, and lot to lot. Mismatch issues arise due to two key issues: (a) the dual polysilicon processing of these devices, which includes etching variations and doping variations, and (b) due to capacitive coupling to the substrate of the devices. The devices are sensitive to cross-talk noise effects since the neuron MOSFETs in bulk technology are capacitively coupled to all other devices through the substrate. This effect tends to worsen as technologies are scaled unless expensive triple well processes are used. Programming voltages and currents can reach the active neuron MOSFET through diode junction breakdown and leakage, which can cause reliability or device degradation issues in the active neuron MOSFET. This occurs in the programming structure of the neuron MOSFET that typically use junction isolated EEPROM technologies. To help eliminate some of these problems (reduce the programming voltages) dual gate oxide processes tend to be used adding cost and complexity to the technology. As pointed out above, because of the junction isolation, there can be a loss in the programming current to the substrate of the technologies hence requiring higher programming voltages or currents than necessary for actual device programming. Higher temperature limitations on the devices also occur due to leakage currents. The devices are susceptible to single-event-upset effects and are potentially susceptible to latch-up effects during programming of the neuron MOSFET and finally, polysilicon/polysilicon capacitors have lower capacitance per unit area than gate-oxide capacitors and thus will require more area than a single-polysilicon process for building neuron MOSFET cells.

For the case of bulk silicon single-polysilicon processes the devices are more sensitive to cross-talk noise effects than the case of the dual polysilicon process since the floating gate in more exposed to substrate capacitance than in the of the dual polysilicon process where the floating gate and the input coupling capacitors can be placed over LOCOS or shallow trench isolation regions. Programming voltages and currents can reach the active neuron MOSFET and can cause reliability or device degradation issues. Similar to the dual polysilicon process, this occurs through diode junction breakdown and leakage. Because of the increased junction area in the single polysilicon neuron MOSFET, the high temperature limitations due to leakage currents become more severe in the single polysilicon process than in the dual polysilicon process. These devices are also more susceptible to single-event-upset effects than the dual polysilicon process due to increased junction areas. As the bias applied to the device changes, the depletion capacitance to the substrate changes. This changes the total capacitance $C_{TOT}$ the above equations and therefore introduces a parasitic non-linearity in the device operating characteristics. Ideally, neuron device operation is linear with respect to the input voltage. Significant parasitic capacitances exist in this technology through the substrate depletion capacitances thereby affecting device performance through device speed and area of devices required to achieve a given resolution or accuracy in the neuron MOSFET behavior.

There is therefore a need for a neuron MOSFET that overcomes that above described limitations of the existing dual polysilicon neuron MOSFET and the single gate neuron MOSFET.

SUMMARY OF INVENTION

The instant invention describes a single polysilicon neuron MOSFET architecture with synaptic learning capability. The structure described is unique to silicon-on-insulator (SOI) substrates and comprises a single polysilicon layer gate structure. In addition, the neuron MOSFET structure of the instant invention has a number of doped regions completely isolated from each other by a number of isolation structures. The structure comprises a contiguous conductive film formed over the MOS transistor region forming a transistor floating gate and other regions of said contiguous conductive film positioned over a number of the doped regions to form input capacitor structures to the neuron MOSFET.

The design of the instant invention allows for the rapid learning (FN programming) or for long term learning (hot-electron programming) without impacting the active region of the neuron MOSFET or other devices on the chip. Other technical advantages will be readily apparent to one skilled in the art from the following FIGURES, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The invention will be described with reference to FIGS. 2–6. It comprises single polysilicon neuron MOSFET architecture with synaptic learning capability on SOI substrates.

Figure 1:
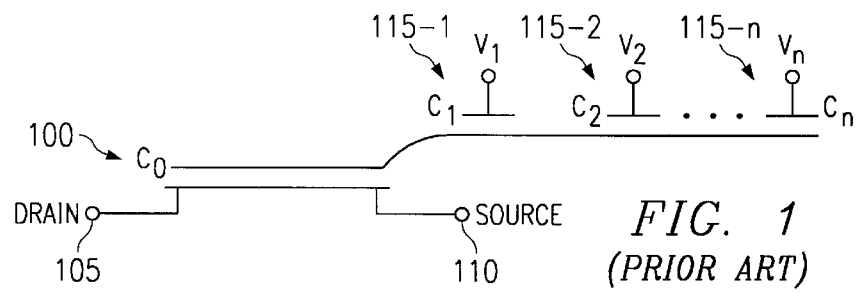
FIG. 1 is a circuit schematic diagram of a neuron MOSFET.
Figure 2A:
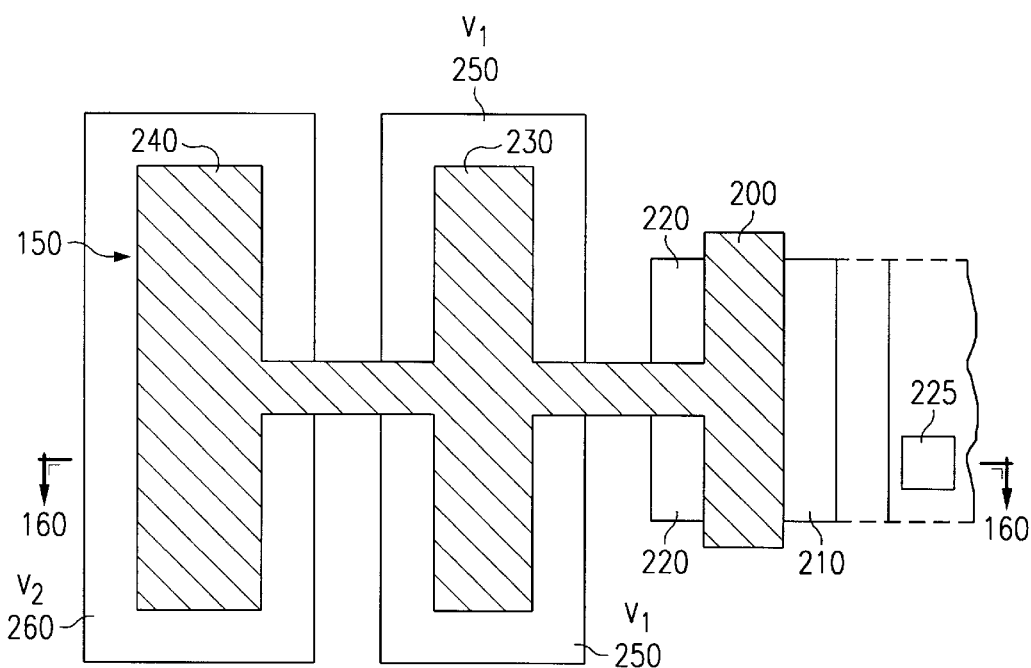
FIGS. 2A–2B are plan and cross-section diagrams showing an embodiment of a SOI neuron MOSFET.
Figure 2B:
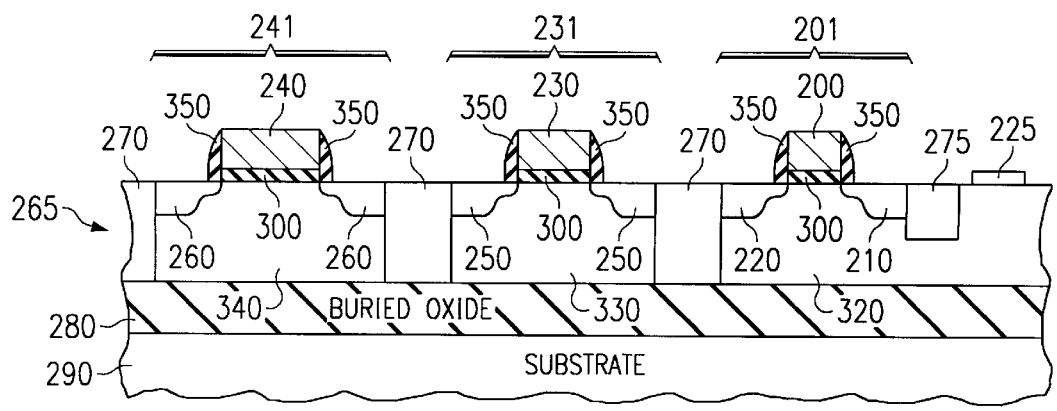

An embodiment of the instant invention is illustrated in FIGS. 2(a) and 2(b). As shown in FIG. 2(a), the neuron MOSFET comprises a floating gate 150. In an embodiment of the instant invention this floating gate is doped polycrystalline silicon (polysilicon) however any conductive film that is suitable for use as a MOSFET gate can be used to form the floating gate 150. Sections of the floating gate 230 and 240 form capacitors that couple the input voltages $V_1$ and $V_2$ to the floating gate 200 of the neuron MOSFET structure 201. The neuron MOSFET structure 201 comprises a source region 220, a drain region 210 and the aforementioned floating gate region 200. As shown in FIG. 2(b), the neuron MOSFET is formed on a silicon-on-insulator (SOI) substrate. This substrate comprises a substrate layer 290, a buried dielectric layer 280, and a top layer 265 in which the neuron transistor is formed. In an embodiment of the instant invention the substrate layer 290, and the top layer 265 will be silicon and the buried dielectric layer 280 will be silicon oxide. In this disclosure the top silicon layer 265 will be referred to as the active silicon layer.

Prior to the formation of the floating gate 150 of the various devices isolation structures 270 and 275 and doped regions 320, 330, and 340 are formed in the active silicon layer 265. The doped regions 320, 330, and 340 can be n-type or p-type but are preferably n-type for regions 320 and 330, and p-type for region 340. These doped regions are typically formed using ion implantation of an n-type or p-type dopant species. In forming the doped regions 330 and 340, on which the MOS capacitor structures will be fabricated, a high doping density is required that is typically greater than $10^{17}$ $cm^{-3}$. The upper limit on the doping density is that which results in significant enhancement in the oxidation rate of silicon. The isolation structures 270 and 275 can be formed using shallow trench isolation (STI) or local oxidation (LOCOS). LOCOS structures are formed by first depositing a nitride film which is then patterned and etched to expose areas in the substrate where the isolation structure is required. The substrate is then oxidized to form the isolation structures. STI structures are formed by first etching a trench in the substrate which is then filled with an insulator. This insulator can be silicon oxide, silicon nitride, or any insulating material with suitable properties. The isolation structures 270 are used to isolate the capacitor structures 231 and 241 from the neuron MOSFET structure 201 and must extend the entire thickness of the active silicon layer 265 to the buried oxide layer 280. The capacitor structures 231 and 241 are thus fully dielectrically isolated from each other and the neuron MOSFET structure 201. Isolation structure 275 extends only partially into the active silicon layer 265 and provides isolation between the contact 225 to region 320 (or substrate contact) and the source/drain region 210 of the neuron MOSFET structure 201.

Following the formation of the doped regions 320, 330, and 340, a gate dielectric 300 and a floating gate structure 150 are formed. The gate dielectric 300 may be comprised of an oxide, thermally grown $SiO_2$, a nitride, an oxynitride, a silicate or any combination thereof. The contiguous floating gate structure 150 comprises the floating gate region of the neuron MOSFET structure 200, a plate region of the first input capacitor structure 230, and a plate region of the second input capacitor structure 240. Any conductive layer can be used to form the floating gate region 150. Preferably, this conductive material is comprised of polycrystalline silicon("poly" or "polysilicon"), but it may be comprised of epitaxial silicon, a metal, a silicate, or any other conducting material. Following the formation of the floating gate region 150, lightly doped drain and source extension implants can be used to form lightly doped regions of the source and drain regions 210, 220 of the neuron MOSFET structure 201. For the formation of a NMOS neuron MOSFET, the active silicon layer region 320 will be p-type and the lightly doped drain and source extension implants will comprise n-type dopant species. For a PMOS neuron MOSFET, the active silicon layer region 320 will be n-type and the lightly doped drain and source extension implants will comprise p-type dopant species. I n some cases sidewall structures 350 can be formed on the edges of the floating gate 150 using a typical silicon nitride or silicon oxide sidewall process. These sidewall structures 350 may be omitted from all the embodiments of the SOI neuron MOSFET of the instant invention without changing the scope of the invention. Following sidewall formation (if present), the neuron MOSFET source and drain regions 210, 220, and t he capacitor contact regions 250 and 260 are formed. For the capacitor structures 231 and 241, the contact regions 250 and 260 must be of the same doping type as the active silicon layer regions 330 and 340 respectively. Thus if region 330 is n-type then contact region 250 must be n-type. Similarly, if region 340 is n-type then contact regions 260 must also be n-type. This relationship holds whether the regions 330 and 340 are n-type or p-type. It is preferable to form the capacitor structures 231 and 241 using n-type active silicon regions 330 and 340 due to higher mobility of electrons compared to holes. The source and drain regions of the neuron MOSFET structure 201 will be n-type for a NMOS neuron MOSFET and p-type for a PMOS neuron MOSFET.

In operation, the input voltages $V_1$, and $V_2$ are applied to the contact regions 250 and 260. These contact regions along with the doped regions 330 and 340 form one set of plates of the input capacitors 231 and 241. The other set of capacitor plates are the floating gate regions 230 and 240. The first capacitor structure 231 therefore comprises a first plate 250, 330, a capacitor dielectric layer 300, and a second plate formed by the floating gate region 230. The capacitor structure thus formed is equivalent to the input capacitor $C_1$, described in the Eq. 1.1. Similarly, the second capacitor structure 241 comprises a first plate 260, 340, a capacitor dielectric layer 300, and a second plate formed by the floating gate region 240. The capacitor structure thus formed is equivalent to the input capacitor $C_2$ described in the Eq. 1.1. As described above each capacitively coupled input voltage $V_1$, and $V_2$ will have an associated weighing factor W which depends on a number of factors including the area of the floating gate regions 230 and 240. When the linear sum of the weighted input voltages exceeds the threshold voltage $V_{TH}$ of the MOSFET structure 201, the MOSFET structure will turn on and the source and drain regions 210 and 220 will be electrically connected. In this structure, the capacitively coupled inputs $V_1$, and $V_2$ are completely dielectrically isolated from the MOSFET structure 201. This isolation is provided by the STI or LOCOS structures 270 and the buried dielectric layer 280. This complete isolation provides a number of advantages for the described neuron MOSFET. By utilizing the structure of the instant invention it is possible to minimize the capacitance of the floating gate to the substrate 290 by using isolation regions covering non-active regions. Because this is a single polysilicon process, it will have better matching conditions than a dual polysilicon process and will not suffer from the bias dependent capacitance to the substrate that is inherent to a bulk silicon single polysilicon process. In addition, because of the full dielectric isolation of these structures, the neuron MOSFET of this invention will be less susceptible to cross-talk noise effects making the devices ideally suited for analog and mixed-signal applications. This will also help improve the noise margins and switching margins for digital applications such as DSP, multi-valued logic, and digital to analog converters.

Figure 3A:
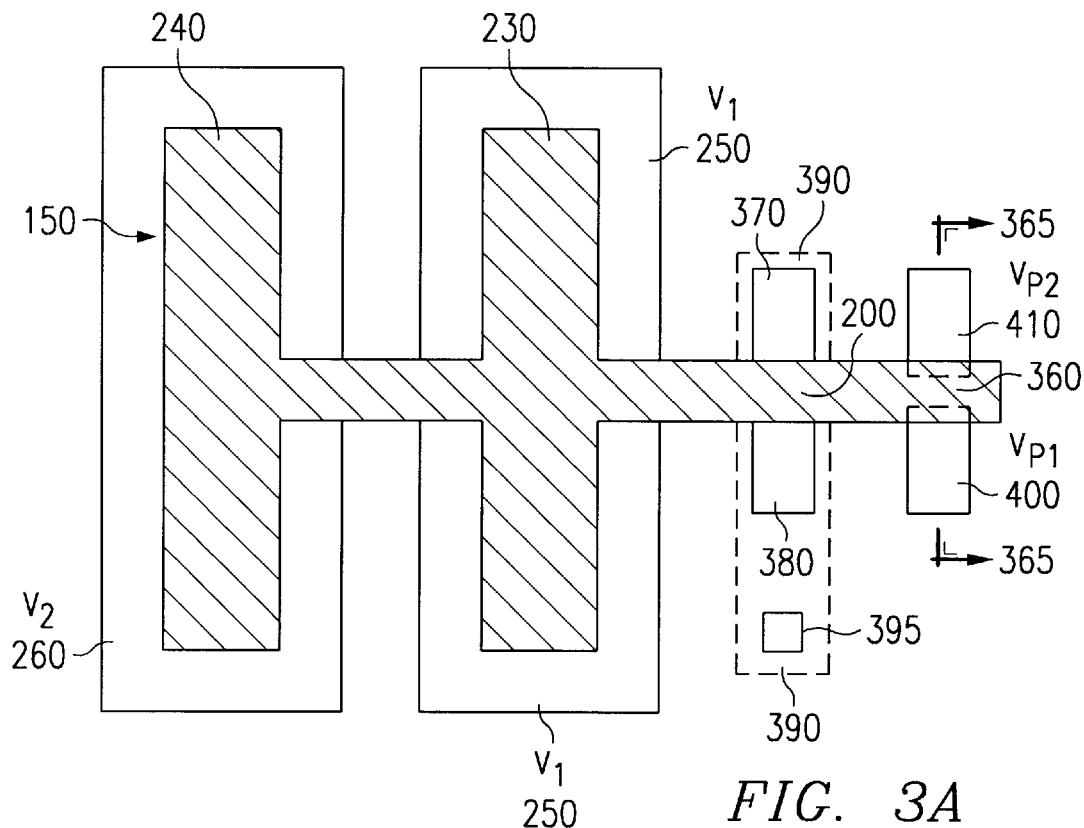
FIGS. 3A–3B are plan and cross-section diagrams showing a further embodiment of a SOI neuron MOSFET.
Figure 3B:
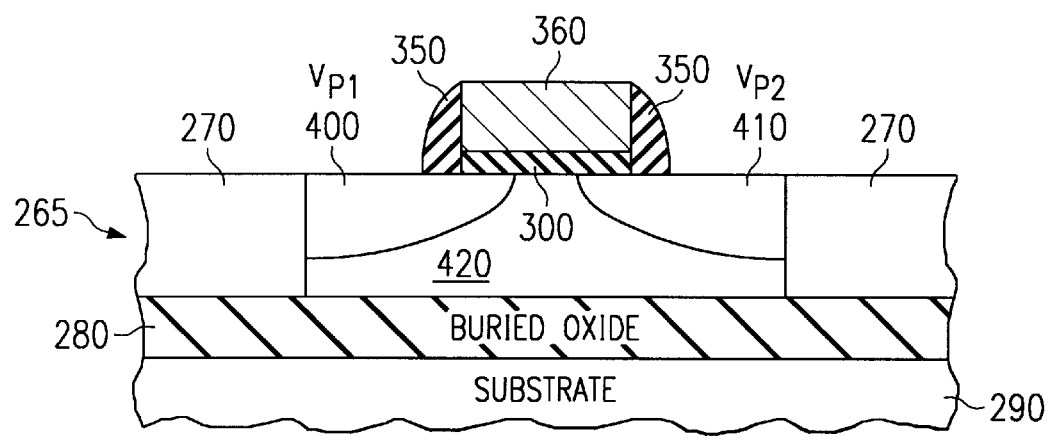

A further embodiment of the instant invention is shown in FIGS. 3(a) and 3(b). Shown in the plan view of FIG. 3(a) is a neuron MOSFET with a programmable node 360. The capacitively coupled input voltages $V_1$, and $V_2$ are applied to contact regions 250 and 260 as described previously. These contact regions along with the underlying doped active substrate region form one plate on the input capacitor. The capacitor dielectric is formed by the dielectric layer and the top capacitor plate is formed by regions 230 and 240 of the floating gate 150. This contiguous floating gate structure 150 comprises the floating gate region 200 of the neuron MOSFET structure, a plate region of the first input capacitor structure 230, a plate region of the second input capacitor structure 240, and the floating gate region 360 of the Fowler Nordheim (FN) programming structure. The neuron MOSFET structure comprises source and drain regions 370 and 380 which are n-type for an NMOS transistor and p-type for PMOS transistor. For a NMOS transistor the substrate region 390 will be p-type and for a PMOS transistor the substrate region will be n-type. A substrate contact 395 is also shown in FIG. 3(a).

A cross-section view of the FN programming structure taken along the line 365—365 is shown in FIG. 3B. The FN structure comprises a substrate region which can be undoped, doped n-type, or doped p-type. The gate dielectric layer 300 is formed over this substrate region, and the floating gate 150 (specifically region 360 of the floating gate) is formed over this gate dielectric region. The gate dielectric 300 may be comprised of an oxide, thermally grown $SiO_2$, a nitride, an oxynitride, a silicate or any combination thereof. Any conductive layer can be used to form the floating gate 150. Preferably, this conductive material is comprised of polycrystalline silicon("poly" or "polysilicon"), but it may be comprised of epitaxial silicon, a silicate, a metal or any other conducting material. In some applications sidewall structures 350 will be formed adjacent to the floating gate 360 using standard sidewall processes. In operation, programming voltages are applied to the heavily doped injection regions 400 and 410. Injection regions 400 and 410 will be doped with opposite doping types. Thus if region 400 is doped n-type then region 410 will be doped p-type and vice versa. It is preferable that the doping concentration in injection regions 400 and 410 exceed $10^7$ $cm^{-3}$. If a large enough voltage is applied (i.e. $V_{p1}$ or $V_{p2}$) then charge will be injected into the floating gate 150 through the floating gate region 360 that overlies region 400 or 410. This injected charge will change the threshold voltage $V_{TH}^*$ of the neuron MOSFET implementing a learning function.

Figure 4A:
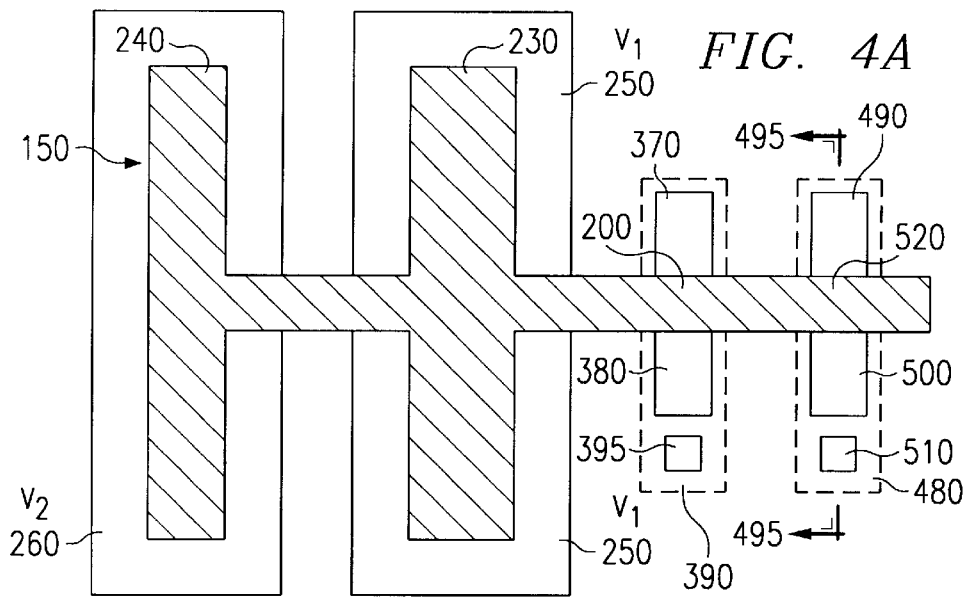
FIGS. 4A–4C are plan and cross-section diagrams showing a further embodiment of a SOI neuron MOSFET.
Figure 4B:
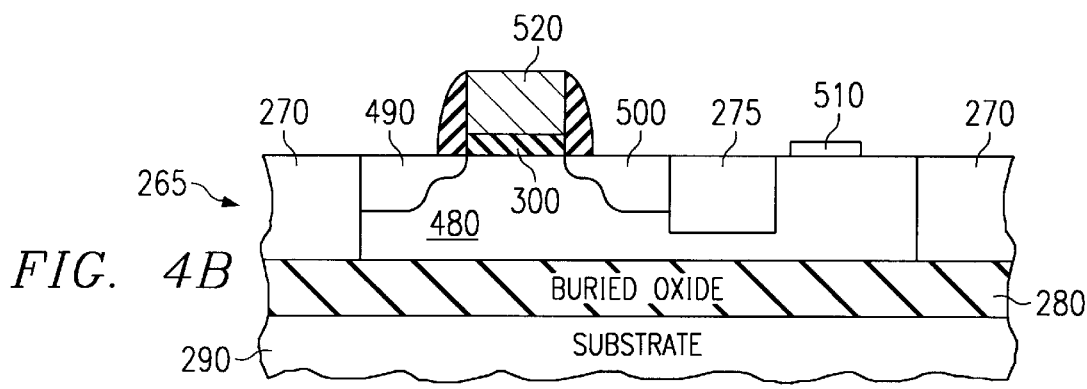

Shown in FIGS. 4(a) and 4(b) is a further embodiment of the instant invention. This embodiment comprises a neutron MOSFET with both a NMOS structure and a PMOS structure. Shown in the plan view of FIG. 4(a) are the floating gate regions of a NMOS transistor 200 and the floating gate region of a PMOS transistor 520. The capacitively coupled input voltages $V_1$, and $V_2$ are applied to contact regions 250 and 260 as described previously. These contact regions along with the underlying doped active substrate regions form one plate on the input capacitor. The capacitor dielectric is formed by the dielectric layer and the top capacitor plate is formed by regions 230 and 240 of the floating gate 150. This contiguous floating gate structure 150 comprises the floating gate region of the NMOS MOSFET structure 200, The PMOS MOSFET structure 520, a plate region of the first input capacitor structure 230, and a plate region of the second input capacitor structure 240. The NMOS MOSFET structure comprises source and drain regions 370 and 380 which are doped n-type. The substrate region 390 will be p-type and a substrate contact 395 is also shown in FIG. 4(a). The PMOS MOSFET structure comprises source and drain regions 490 and 500 which are doped p-type. The substrate region 480 will be n-type and a substrate contact 510 is also shown in FIG. 4(a).

A cross-section through the line 495—495 in FIG. 4(a) is shown in FIG. 4(b). The PMOS structure comprises a substrate region which is doped n-type 480. The gate dielectric layer 300 is formed over this substrate region, and the floating gate 150 (specifically region 520 of the floating gate) is formed over this gate dielectric region. The gate dielectric 300 may be comprised of an oxide, thermally grown SiO2, a nitride, an oxynitride, a silicate or any combination thereof. Any conductive layer can be used to form the floating gate 150. Preferably, this conductive material is comprised of polycrystalline silicon("poly" or "polysilicon"), but it may be comprised of epitaxial silicon, a silicate, a metal or any other conducting material. In some applications sidewall structures 350 will be formed adjacent to the floating gate 520 using standard sidewall processes. The source and drain regions 495 and 500 will be doped p-type. It is preferable that the doping concentration in regions 495 and 500 both exceed $10^{17}$ cm$^{-3}$. An isolation structure 275 separates the PMOS structure from the substrate contact 510.

Figure 4C:
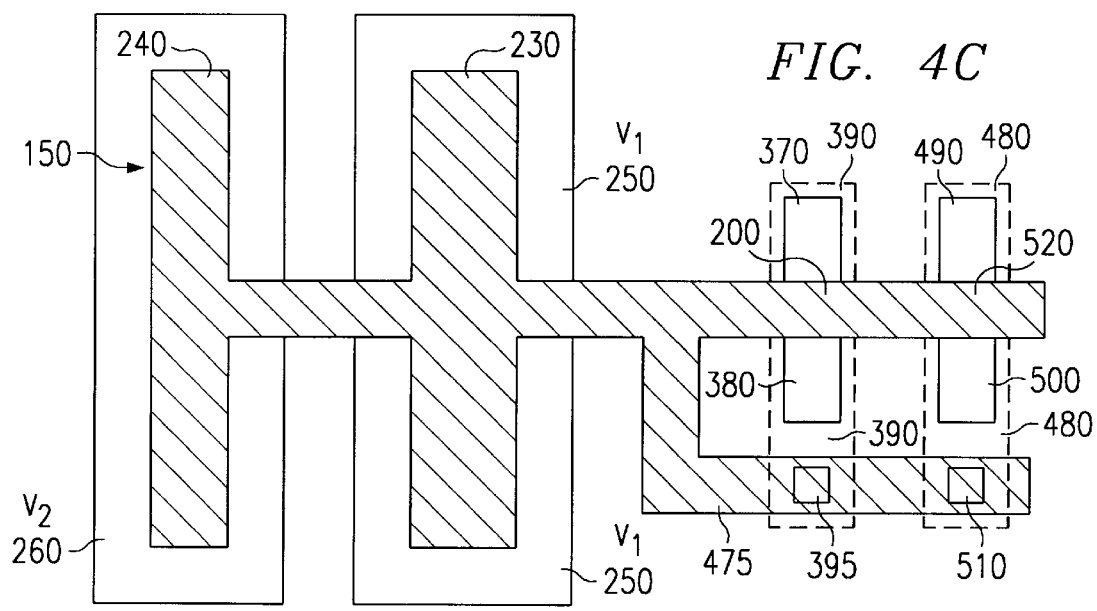

A further embodiment is shown in FIG. 4(c). As shown here, the floating gate 150 is extended to contact the substrate contacts 395 and 510 of the NMOS and PMOS MOSFET transistors respectively. Connecting the floating gate 150 to the transistor substrate contacts 395 and 510 enhances the switching speed of the neuron MOSFET in a manner similar to that of bulk silicon circuits which use dynamic transistor gate biasing techniques. It will sometimes be beneficial to connect the floating gate to the substrate of the PMOS transistor structure only. Under this condition the PMOS switching speed is increased while the potential floating body effects of the NMOS structure such as the well known "kink" effect can be avoided by having a normal body contact.

Figure 5A:
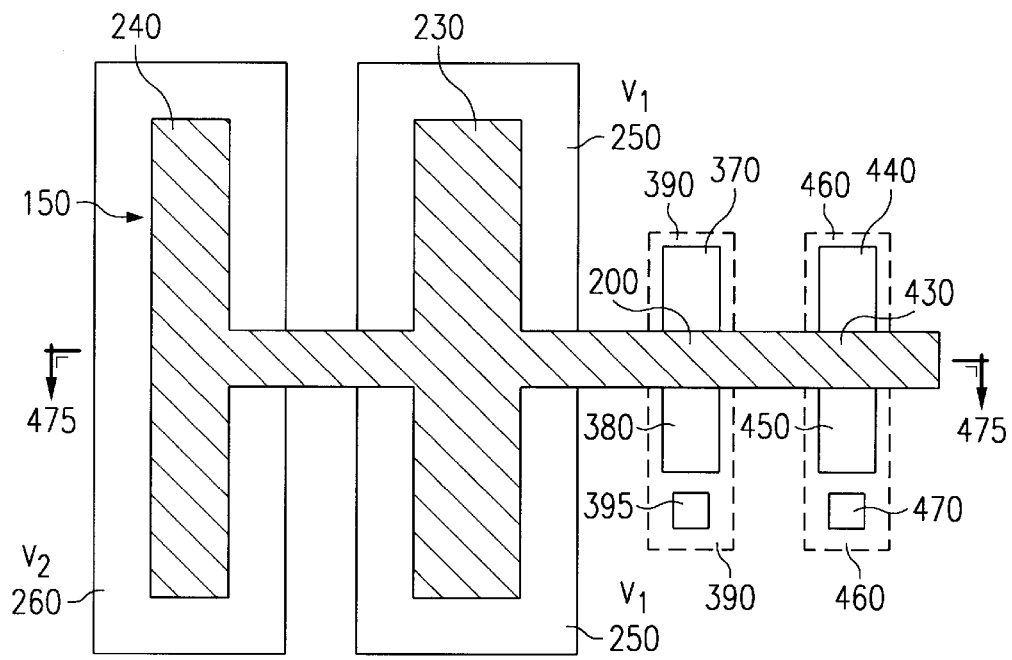
FIGS. 5A–5B are plan and cross-section diagrams showing an embodiment of a SOI neuron nMOSFET and pMOSFET.
Figure 5B:
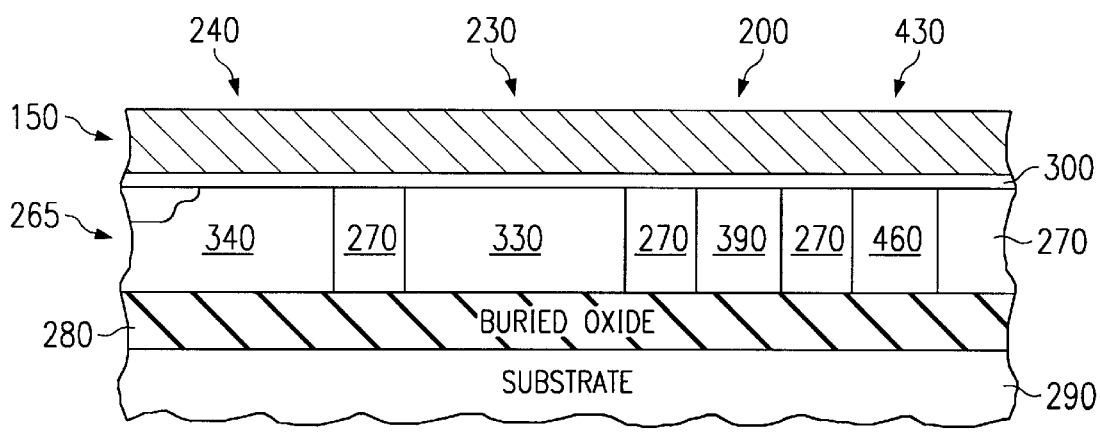

In some applications it is advantageous to program the neuron MOSFET using a more controlled and slower process that the FN method described above. An embodiment illustrating a neuron MOSFET with more controlled and slower programming is illustrated in FIGS. 5(a) and 5(b). This embodiment comprises two MOSFET structures, one of which provides the functionality of the neuron MOSFET and the second provides the programming function using hot carrier injection. This contiguous floating gate structure 150 comprises the floating gate region 200 of the neuron MOSFET structure, a plate region of the first input capacitor structure 230, a plate region of the second input capacitor structure 240, and the floating gate region 430 of the hot carrier NMOS MOSFET programming structure. The hot carrier NMOS structure comprises n-type source and drain regions 440, 450 and a p-type substrate region 460 with a substrate contact 470. The doping concentrations and profiles of the source and drain regions 440 and 450 along with the dimensions (ie. length and width) of the floating gate region 430 are optimized to produce hot carrier (in this electrons) injection into the floating gate 430 under certain bias voltage conditions. These bias conditions will depend on the input voltages $V_1$ and $V_2$, and the voltages applied to the source and drain regions 440 and 450 and the substrate contact 470. Shown in FIG. 5(b) is a cross-section taken through line 475—475 of FIG. 5(a). Shown are the active substrate regions for the capacitor structures 330 and 340, as well as the substrate region for the programming NMOS structure 460. The substrate of the programming MOSFET structure 460 is completely isolated from substrate of the MOS structure 390 which provides the functionality for the neuron MOSFET.

Figure 6A:
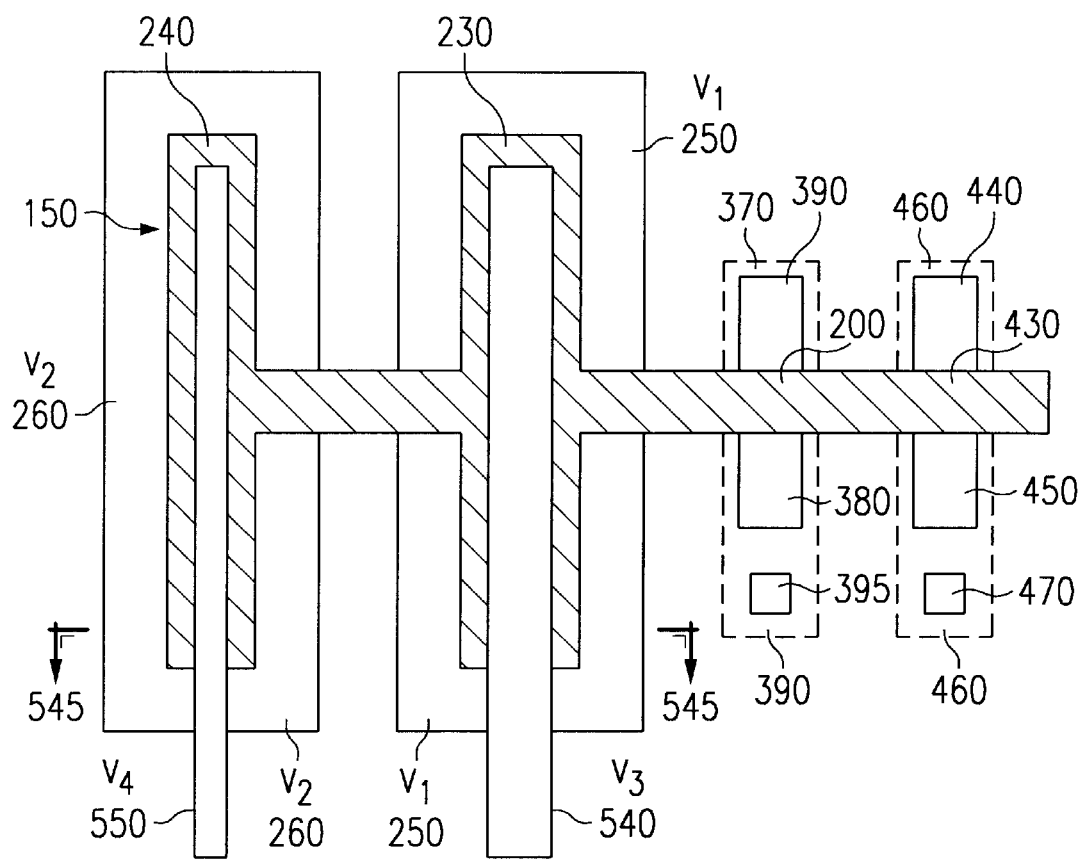
FIGS. 6A–6B are plan and cross section diagrams showing a double polysilicon SOI neuron MOSFET.
Figure 6B:
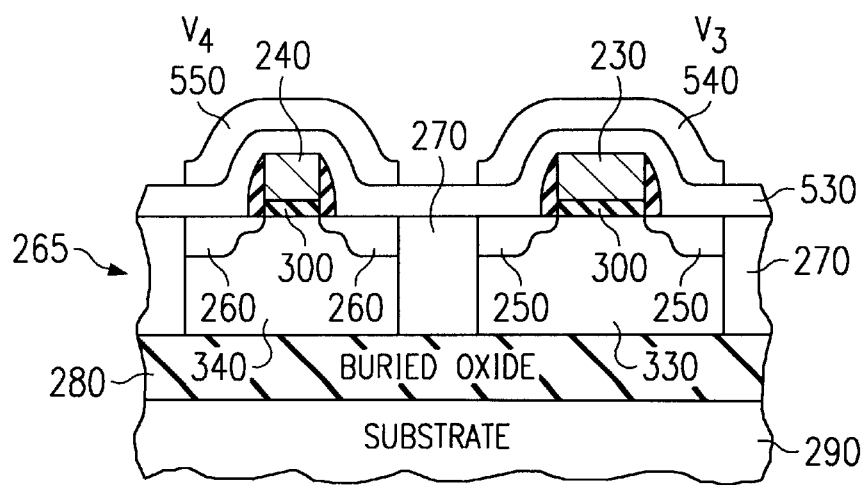

Shown in FIGS. 6(a) and 6(b) are further embodiments of the instant invention. Here a dual polysilicon process is used to increase the capacitance at the input to the neuron MOSFET. As shown in FIG. 6(a), the capacitively coupled input voltages $V_1$, and $V_2$ are applied to contact regions 250 and 260. These contact regions along with the underlying doped active substrate region form one plate on the input capacitor. The capacitor dielectric is formed by the dielectric layer 300 and the top capacitor plate of the lower capacitors are formed by regions 230 and 240 of the floating gate 150. This contiguous floating gate structure 150 comprises the floating gate region of the NMOS MOSFET structure 200, a hot carrier MOSFET structure 430, a plate region of the first input capacitor structure 230, and a plate region of the second input capacitor structure 240. Shown in FIG. 6(b) is the cross-section of the dual capacitors through line 545—545 of FIG. 6(a). A second dielectric layer 530 is formed over regions 230 and 240 of the floating gate 150. A second conductive layer is formed and patterned over the second dielectric layer to form the plates of the upper capacitors. The input capacitors of the upper capacitors are formed by conductive layers 540 and 550, the second. dielectric layer 530 and regions 230 and 240 of the floating gate dielectric. Preferably, the patterned conductive layers 540 and 550 is comprised of polycrystalline silicon("poly" or "polysilicon"), but it may be comprised of epitaxial silicon or any other conducting material. The second dielectric layer 530 can be comprised of an oxide, an oxynitride, a silicate, or any combination of these materials. The input voltages $V_3$ and $V_4$ are applied to the polysilicon layers 540 and 550 which form plates of the upper capacitor structures.

The neuron MOSFET of the instant invention has been described using a number of embodiments. It should be noted that these embodiments are no inclusive of all possible variations of the instant invention. For example, the neuron MOSFET can be formed using any combination of NMOS, PMOS, FN structure, and hot carrier structure. In addition, any combination of single and dual polysilicon input capacitance structure and be used with any of the above described structures. The neuron MOSFET of the instant invention can be implemented in any standard CMOS process without added process complexity. Fast learning rate (FN structures) or slow learning rate (hot carrier MOSFETs) can be simply incorporated into the neuron MOSFET structure. The structure can be implemented using SOI with any thickness of the active silicon layer. The floating polysilicon gate 150 in the above embodiments can be silicided to improve the high frequency performance of the neuron MOSFET. In addition, the neuron MOSFET described above can be extended to include any number of input capacitor structures to allow the use of any number of input voltages $V_1, V_2, \ldots, V_n$.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A silicon on insulator neuron MOSFET, comprising:
   providing a silicon on insulator substrate with an active silicon layer and a buried insulator;
   a plurality of doped regions including a first doped region completely isolated from each other by a plurality of isolation structures;
   source and drain regions formed in said first doped region and separated by a first distance;

a dielectric film formed over said plurality of doped regions including said first doped region; and a contiguous conductive film formed over said dielectric film with a first region positioned between said source and drain region thereby forming a transistor floating gate and other regions of said contiguous conductive film position ed over said plurality of doped regions to form input capacitor structures.

2. The silicon on insulator neuron MOSFET of claim 1 wherein said plurality of isolation structures comprises shallow trench isolation.

3. The silicon on insulator neuron MOSFET of claim 1 wherein said plurality of isolation structures comprises LOCOS.

4. The silicon on insulator neuron MOSFET of claim 1 wherein said dielectric film is a material selected from the group consisting of an oxide, a nitride, an oxynitride, and a silicate.

5. The silicon on insulator neuron MOSFET of claim 1 wherein said contiguous conductive film is a material selected from the group consisting of polysilicon, epitaxial silicon, and a metallic film.

6. The silicon on insulator neuron MOSFET of claim 1 wherein said input capacitor structures comprise said plurality of doped regions, said dielectric film, and regions of said contiguous conductive films.

7. A silicon on insulator neuron MOSFET, comprising:
providing a silicon on insulator substrate with an active silicon layer and a buried insulator;

a plurality of doped regions including a first n-type doped region and a second p-type doped region completely isolated from each other by a plurality of isolation structures;

p-type source and drain regions formed in said first doped region and separated by a first distance;

n-type source and drain regions formed in said second doped region and separated by a second distance;

a dielectric film formed over said plurality of doped regions including said first n-type doped region and said second p-type doped region; and a contiguous conductive film formed over said dielectric film with a first region positioned between said p-type source and drain region thereby forming a PMOS transistor floating gate, a second region positioned between said n-type source and drain region thereby forming a NMOS transistor floating gate, and other regions of said contiguous conductive film positioned over said plurality of doped regions to form capacitor structures.

8. The silicon on insulator neuron MOSFET of claim 7 wherein said plurality of isolation structures comprises shallow trench isolation.

9. The silicon on insulator neuron MOSFET of claim 7 wherein said plurality of isolation structures comprises LOCOS.

10. The silicon on insulator neuron MOSFET of claim 7 wherein said dielectric film is a material selected from the group consisting of an oxide, a nitride, an oxynitride, and a silicate.

11. The silicon on insulator neuron MOSFET of claim 7 wherein said contiguous conductive film is a material selected from the group consisting of polysilicon, epitaxial silicon, and a metallic film.

12. The silicon on insulator neuron MOSFET of claim 7 wherein said input capacitor structures comprise said plurality of doped regions, said dielectric film, and regions of said contiguous conductive films.

13. A silicon on insulator neuron MOSFET, comprising:
providing a silicon on insulator substrate with an active silicon layer and a buried insulator;

a plurality of doped regions including a first doped region and a second p-type doped region completely isolated from each other by a plurality of isolation structures;

source and drain regions formed in said first doped region and separated by a first distance;

n-type source and drain regions formed in said second doped region and separated by a second distance wherein said n-type source and drain regions and said second distance are optimized for hot carrier electron injection;

a dielectric film formed over said plurality of doped regions including said first doped region and said second p-type doped region; and a contiguous conductive film formed over said dielectric film with a first region positioned between said source and drain region thereby forming a first transistor floating gate, a second region positioned between said n-type source and drain region thereby forming a NMOS transistor floating gate optimized for hot carrier injection, and other regions of said contiguous conductive film positioned over said plurality of doped regions to form capacitor structures.

14. The silicon on insulator neuron MOSFET of claim 13 wherein said plurality of isolation structures comprises shallow trench isolation.

15. The silicon on insulator neuron MOSFET of claim 13 wherein said plurality of isolation structures comprises LOCOS.

16. The silicon on insulator neuron MOSFET of claim 13 wherein said dielectric film is a material selected from the group consisting of an oxide, a nitride, an oxynitride, and a silicate.

17. The silicon on insulator neuron MOSFET of claim 13 wherein said contiguous conductive film is a material selected from the group consisting of polysilicon, epitaxial silicon, and a metallic film.

18. The silicon on insulator neuron MOSFET of claim 13 wherein said input capacitor structures comprise said plurality of doped regions, said dielectric film, and regions of said contiguous conductive films.

19. A silicon on insulator neuron MOSFET, comprising:
providing a silicon on insulator substrate with an active silicon layer and a buried insulator;

a plurality of doped regions including a first doped region and a second doped region completely isolated from each other by a plurality of isolation structures;

source and drain regions formed in said first doped region and separated by a first distance;

a n-type injection region and a p-type injection region formed in said second doped region and separated by a second distance;

a dielectric film formed over said plurality of doped regions including said first doped region and said second doped region; and a contiguous conductive film formed over said dielectric film with a first region positioned between said source and drain region thereby forming a first transistor floating gate, a second region positioned between said n-type injection region and said p-type injection region thereby forming a FN programming structure, and other regions of said contiguous conductive film positioned over said plurality of doped regions to form capacitor structures.

20. The silicon on insulator neuron MOSFET of claim 19 wherein said plurality of isolation structures comprises shallow trench isolation.

21. The silicon on insulator neuron MOSFET of claim 19 wherein said plurality of isolation structures comprises LOCOS.

22. The silicon on insulator neuron MOSFET of claim 19 wherein said dielectric film is a material selected from the group consisting of an oxide, a nitride, an oxynitride, and a silicate.

23. The silicon on insulator neuron MOSFET of claim 19 wherein said contiguous conductive film is a material selected from the group consisting of polysilicon, epitaxial silicon, and a metallic film.

24. The silicon on insulator neuron MOSFET of claim 19 wherein said input capacitor structures comprise said plurality of doped regions, said dielectric film, and regions of said contiguous conductive films.

* * * * *